United States Patent [19]

Matsuura et al.

[11] 3,953,760

[45] Apr. 27, 1976

[54] DYNAMIC ELECTRON BEAM CONVERGENCE APPARATUS

[75] Inventors: Toshiro Matsuura, Moriguchi; Minoru Takeda, Hirakata, both of Japan

[73] Assignee: Matsushita Electric Industrial Co., Ltd., Osaka, Japan

[22] Filed: Apr. 10, 1974

[21] Appl. No.: 459,856

[22] Filed: Apr. 10, 1974

[21] Appl. No.: 459,856

[52] U.S. Cl. ............................................. 315/13 C
[51] Int. Cl.² ........................................ H01J 29/51
[58] Field of Search ................................. 315/13 C

[56] References Cited
UNITED STATES PATENTS

| | | | |
|---|---|---|---|
| 3,273,008 | 9/1966 | Galloway et al. | 315/13 C |
| 3,602,764 | 8/1971 | Poel | 315/13 C |
| 3,767,962 | 10/1973 | Arya | 315/13 C |
| 3,784,869 | 1/1974 | Takahashi | 315/13 C |
| 3,821,591 | 6/1974 | Lister | 315/13 C |

Primary Examiner—T. H. Tubbesing
Assistant Examiner—G. E. Montone
Attorney, Agent, or Firm—Wenderoth, Lind & Ponack

[57] ABSTRACT

An apparatus for converging three electron beams accurately on the picture tube screen of a color television reproducing system. In this apparatus, a controlled pulse is produced from a deflection drive pulse which is supplied to the reproducing system as one of several synchronizing pulses separately from the color component signals, or is produced from a synchronizing pulse which is separated from the composite signal in the reproducing system. Desired tilt controlled parabola currents are produced from the sawtooth voltage which is generated from the controlled pulse the position of the leading edge and pulse width of which are preferably set for adjusting the phase of the convergence fields relative to that of the deflection field and to avoid causing a distortion of the resultant parabola currents at the end of the blanking period.

19 Claims, 27 Drawing Figures

DYNAMIC ELECTRON BEAM CONVERGENCE APPARATUS

BACKGROUND OF THE INVENTION

This invention relates to an apparatus for converging three electron beams accurately on a picture tube screen, and more particularly relates to a dynamic convergence apparatus for a color television reproducing system which utilizes a densely doted cathode ray tube and needs an accurate convergence of the electron beams from three guns, or for a color monitor system to which a horizontal drive pulse and a vertical drive pulse are provided separately from color component signals.

To converge the beams on the picture tube screen after adjusting them at the center of the picture screen by carrying out static convergence, the parabola currents which flow through the convergence coils are caused to be such that the amplitude and amplitude balance between the first half and the second half of the scanning period are controlled, respectively. According to the conventional convergence apparatus, pulses which are supplied by a winding of a deflection output transformer or a flyback transformer, and sawtooth voltages which are produced by integrating the pulses by means of inductors are supplied to the convergence coils, and they are integrated by the self-inductances of the convergence coils to produce the desired tilt controlled parabola currents. There has also been proposed a convergence apparatus which derives the sawtooth voltages from the deflection coil and amplifies them before supplying them to the convergence coils.

In a color monitor which operates also in a state of under scanning and a color television reproducing apparatus which utilizes a densely dotted picture tube or a picture tube with a wide deflection angle, it is necessary to control the wave shape of the convergence currents more accurately. But is is difficult to converge the three beams accurately especially in the corner portions of the picture screen because of the distortion at the top end portion of the sawtooth voltage waves which are supplied to the convergence coils and the time lag of the convergence fields.

SUMMARY OF THE INVENTION

An object of the present invention, therefore, is to provide a dynamic convergence apparatus which make it possible to converge the three beams more accurately in the corner portions of the picture screen as well as in other portions.

Another object of the present invention is to provide a dynamic convergence apparatus which is adapted for a color television reproducing system which utilizes a wide deflection angle picture tube.

A further object of the present invention is to provide an excellent vertical dynamic convergence apparatus.

A still further object of the present invention is to provide an excellent horizontal dynamic convergence apparatus in which the shape of the parabola currents is controlled accurately.

These objects are achieved according to the present invention by the provision of an excellent dynamic convergence apparatus comprising input circuit means through which a deflection drive pulse or a pulse produced therefrom is supplied, means connected to the input circuit means for generating a controlled pulse the position of the leading edge of which is adjusted to correspond to that of the deflection drive pulse and the width of which is made equal to or shorter than the flyback period of the deflection, sawtooth voltage generating means coupled to the controlled pulse generating means for responding to the controlled pulse to produce a sawtooth voltage, circuit means coupled to the sawtooth voltage generating means for responding to the sawtooth voltage to produce parabola currents which flow through the convergence coils, and convergence control means coupled to the parabola current producing means for controlling the amplitude of the parabola currents and the amplitude balance thereof between the first half and the second half of the scanning period, whereby the parabola currents have substantially no distortion at the end of the blanking period.

Other objects and advantages will be apparent from the following description of some practical embodiments of the invention.

DESCRIPTION OF THE PREFERRED EMBODIMENTS

Figure 1:
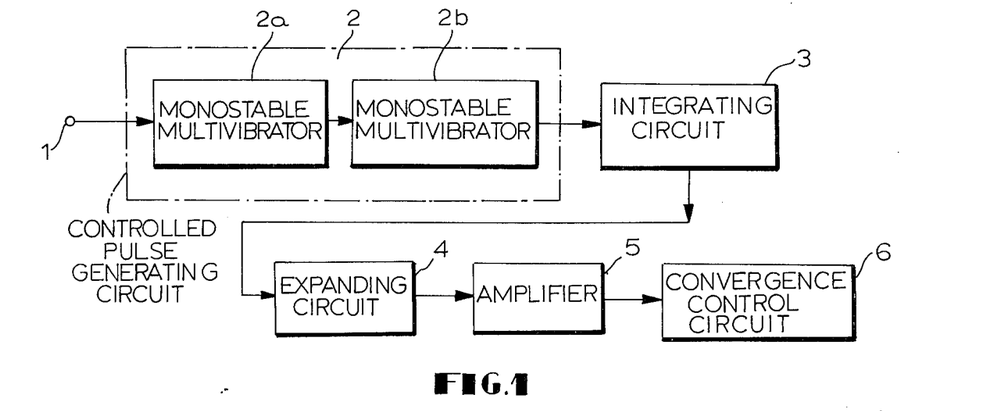
FIG. 1 is a block diagram showing the constitution of one convergence circuit unit of a vertical dynamic convergence apparatus according to this invention.
Figure 2:
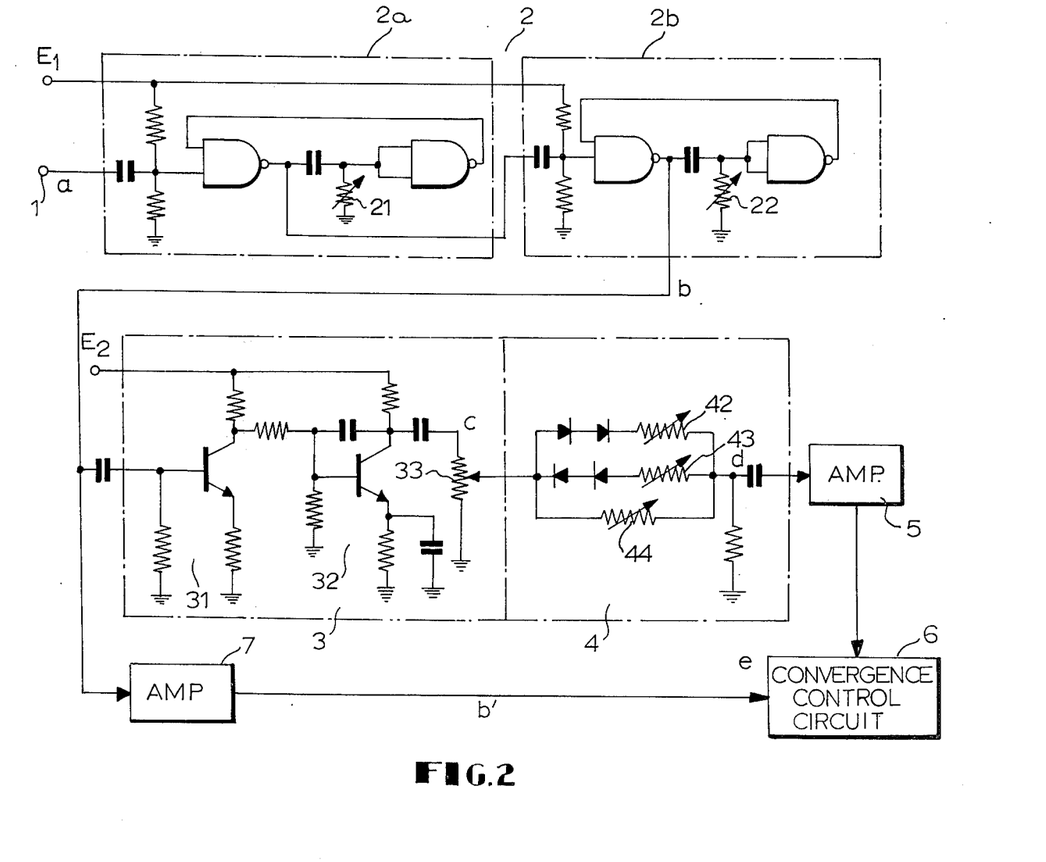
FIG. 2 is a circuit diagram of the electrical circuitry corresponding to the block diagram of FIG. 1.
Figure 3A:
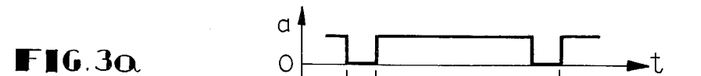
FIGS. 3a–d are diagrams of voltage waveforms and FIG. 3e is a diagram of a current waveform at the points in FIG. 2 with the corresponding letters.
Figure 3B:
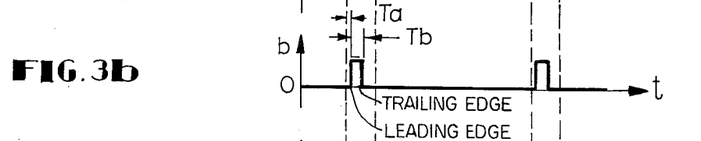
Figure 3C:
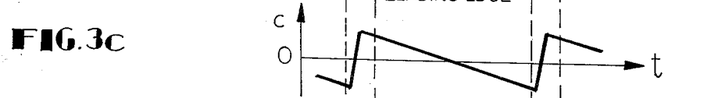
Figure 3D:
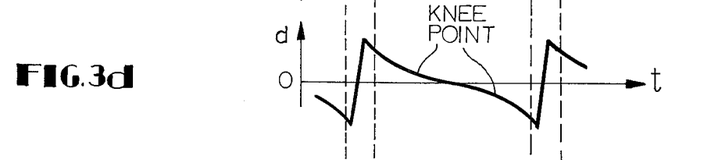

In a first embodiment of the invention, shown in FIGS. 1–3, and which is adapted for a vertical dynamic convergence apparatus, a vertical drive pulse as shown in FIG. 3d is provided through an input circuit 1 to a controlled pulse generating circuit 2 shown in block form in FIG. 1. The vertical drive pulse is one of the synchronous pulses supplied to the color television reproducing system which utilizes this apparatus separately from the color component signals, or a vertical synchronizing pulse which is separated form the composite signal which is supplied to the color television reproducing system. In the controlled pulse generating circuit 2, a controlled pulse as shown in FIG. 3b is produced, the position of the leading edge of which is behind that of the vertical drive pulse by time Ta, and the width Tb of which is selected so that the time interval Ta + Tb is shorter than the flyback period Tf of the system. As shown in FIG. 2, the controlled pulse generating circuit 2 is comprised of two monostable multivibrators 2a and 2b, and the lag time Ta and the pulse width Tb are controlled by variable resistors 21 and 22, respectively. If necessary, the lag time Ta can be zero. In this case the monostable multivibrator 2a is not needed and is omitted and the vertical driver pulse is provided directly to the monostable multivibrator 2b.

The controlled pulse of FIG. 3b is integrated by an integrating circuit 3 connected to controlled pulse generating circuit 2 as shown in FIG. 1. Integrating circuit 3 comprises a pulse amplifier 31, a Miller integrator 32 and a variable resistor 33 as shown in FIG. 2, and produces a sawtooth voltage as shown in FIG. 3c, the amplitude of which is controlled by the variable resistor 33. An expanding circuit 4 is connected to integrating circuit 3 as shown in FIG. 1, and comprises four diodes, three variable resistors 42, 43 and 44 as shown in FIG. 2, and expands the leading and trailing edge portions of the sawtooth voltage of FIG. 3c. The modified sawtooth voltage is shown in FIG. 3d, and the wave form thereof is changeable by controlling the variable resistors 42, 43 and 44. The resistors 42 and 43 change the knee points on the modulated sawtooth voltage, and the resistor 44 changes the amount of transmission of the expanding circuit 4. The modified sawtooth voltage is amplified by an amplifier 5 connected to expanding circuit 4 and the expanded voltage is supplied to a convergence control circuit 6 connected to amplifier 5 which includes red, green and blue vertical convergence coil circuits for responding to the modified sawtooth voltage to produce parabola currents, and amplitude control circuits which control the amplitude of each parabola current (shown in FIG. 3e) flowing through the corresponding convergence coil and the amplitude balance between the first half and the second half of the scanning period Ts of the vertical deflection. In this embodiment, the convergence control circuit 6 is a conventional vertical convergence circuit. For instance, the circuit shown in FIG. 15 can be such a vertical convergence control circuit, where the parabola currents are produced by making use of the conductive characteristics of diodes.

Figure 15:
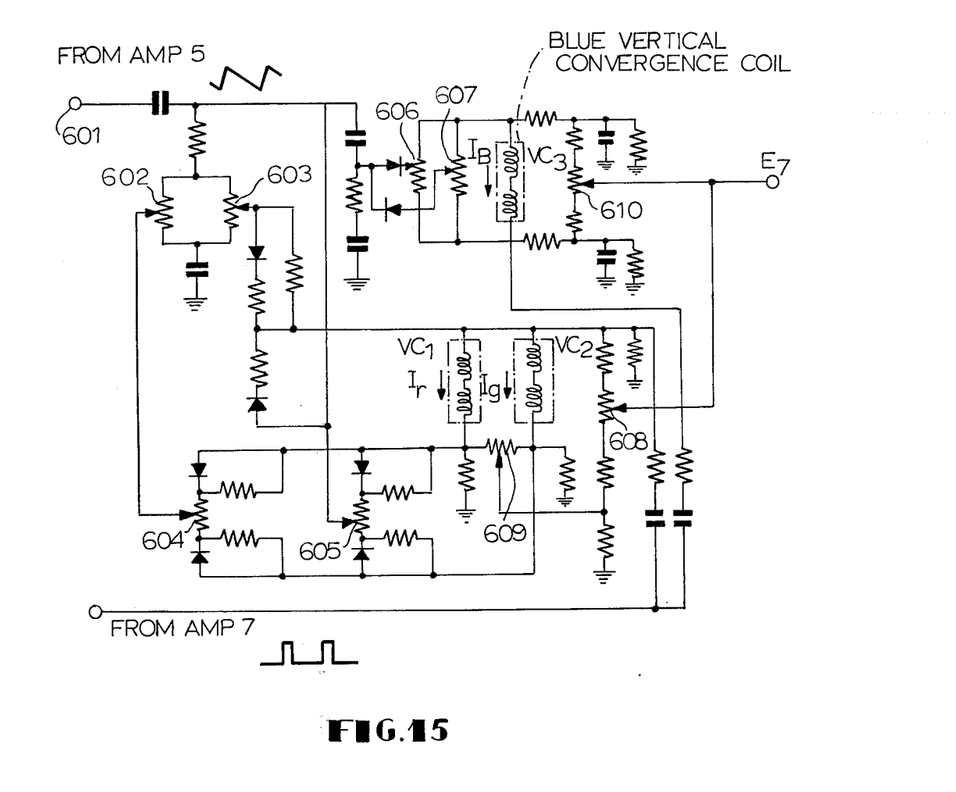
FIG. 15 is a circuit diagram of a convergence control circuit 6 in FIG. 2.

In FIG. 15, the amplified expanded sawtooth voltage from the amplifier 5 is supplied through an input terminal 601 to this circuit. Variable resistors 602 and 603 control the amplitude of the currents Ir and Ig which flow through a red convergence coil VC1 and a green convergence coil VC2 at the first half and the second half of the scanning period respectively. Variable resistors 604 and 605 control the amplitude of those currents differentially at the first half and the second half of the scanning period respectively. Variable resistors 606 and 607 control the amplitude of Ib which flows through a blue convergence coil VC3 at each half of the scanning period respectively.

Variable resistors 608, 609 and 610 control the amplitude of the DC component of each convergence current for the purpose of the static convergence The operation of this circuit can be understood easily, and no further details are needed.

To correct the distortion of the parabola currents at the beginning of the scanning period and the lag of the resultant convergence fields, pulses produced by amplifying the controlled pulse shown in FIG. 3b in an amplifier 7 are supplied to the convergence coils.

Figure 3E:
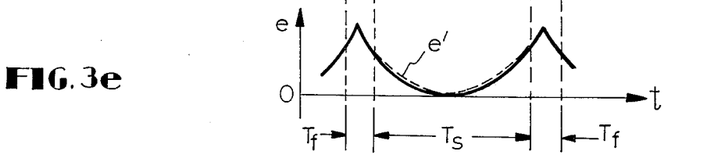

According to this embodiment, as the time interval Ta + Tb is shorter than that of the flyback period Tf, the distortion of the parabola currents at the end of the blanking period is greatly decreased. Consequently, the mis-convergence at the corner portions of the picture tube caused by the distortion, becomes so small as to be neglected. Both edge portions of the parabola current are expanded as shown in FIG. 3e by the expanding circuit 4, and as a result, the amount of correction there becomes greater than that of a dynamic convergence apparatus without the present apparatus, the parabola current of which is shown as a dotted line e' in FIG. 3e. This apparatus is adapted for a color television reproducing system such as one which has a deflection angle of 110° or more.

Figure 4:
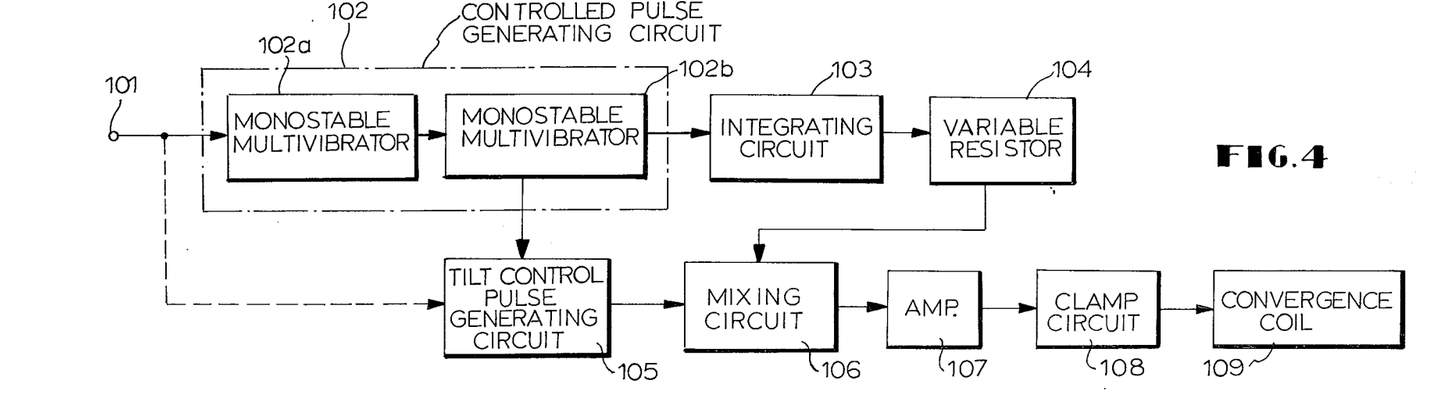
FIG. 4 is a block diagram showing the constitution of one convergence circuit unit of a horizontal dynamic convergence apparatus according to this invention.
Figure 5:
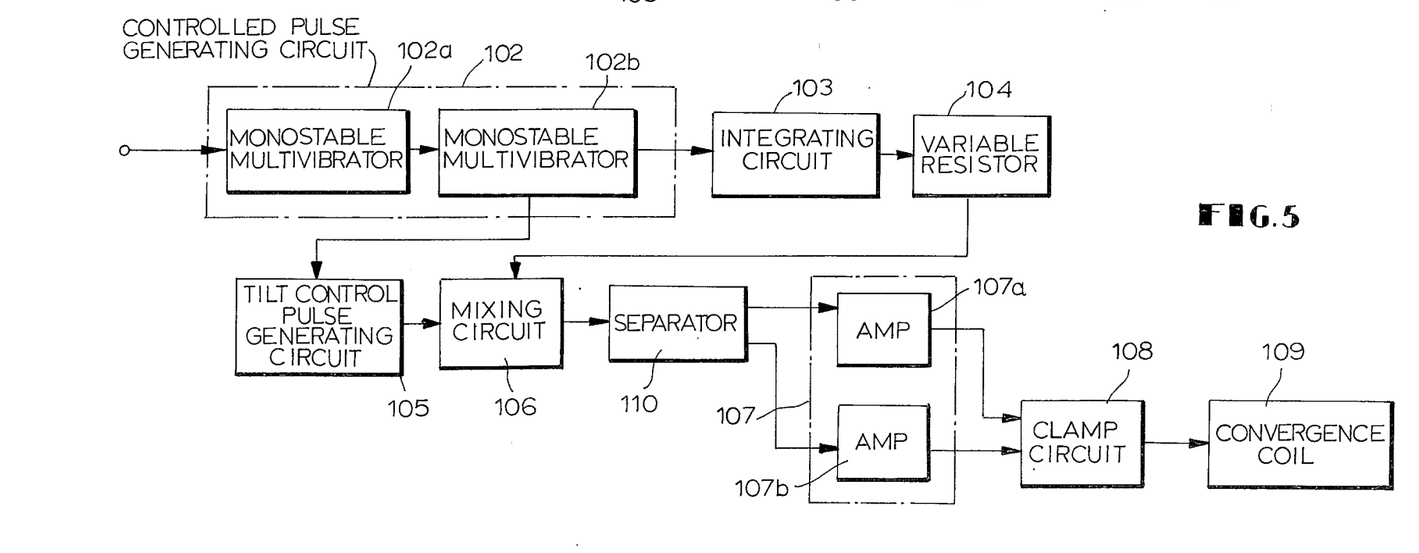
FIG. 5 is a block diagram showing the constitution of another embodiment of a horizontal dynamic convergence apparatus according to this invention.
Figure 6:
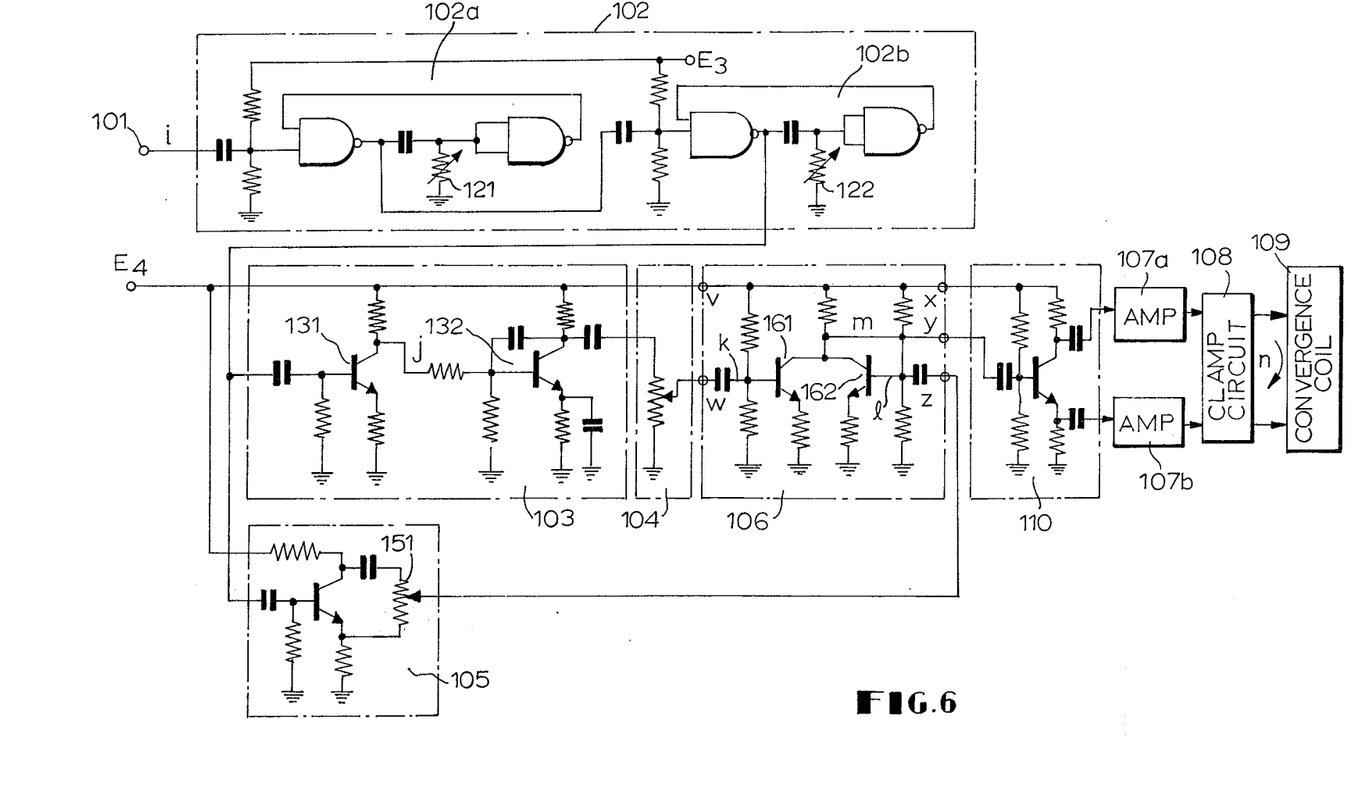
FIG. 6 is a circuit diagram of the electrical circuitry corresponding to the block diagram shown in FIG. 4 and FIG. 5.
Figures 7I, 7J:
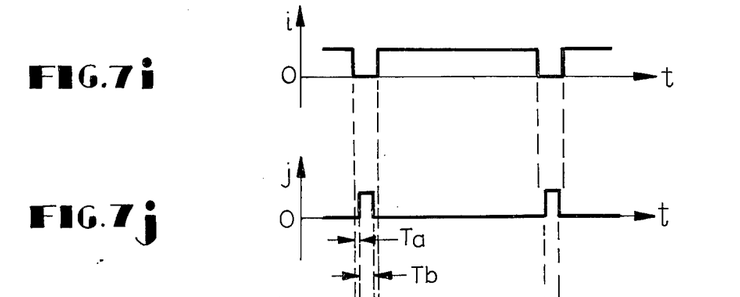
FIGS. 7i–7m are diagrams of voltage waveforms and FIG. 7n is a diagram of a current waveform at the points of FIG. 6, with the corresponding letters.
Figure 7K:
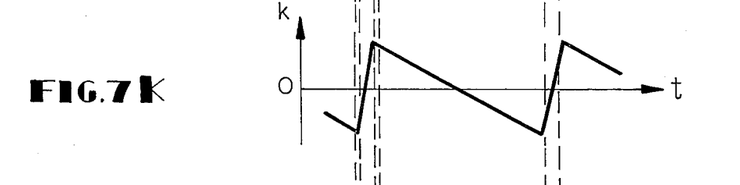

FIG. 4 and FIG. 5 show other embodiments which are adapted for use as horizontal convergence apparatuses. A horizontal deflection drive pulse (as shown in FIG. 7i) is supplied through an input circuit 101 to a controlled pulse generating circuit 102 shown in FIG. 4. The horizontal drive pulse of FIG. 7i is one of the synchronizing pulses or a pulse produced therefrom, which are supplied to the reproducing system. The controlled pulse generating circuit 102 has the same construction as the controlled pulse generating circuit 2 of FIG. 1. The waveform of the controlled pulse output is as shown in FIG. 7j. The delay time Ta thereof and the pulse width Tb are controlled by the variable resistor 121 of the monostable multivibrator 102a and the variable resistor 122 of the monostable multivibrator 102b, respectively, as shown in FIG. 6. If a delay time Ta=0 is desired, the monostable multivibrator 102a should be omitted and the horizontal drive pulse is supplied to the monostable multivibrator 102b directly. The controlled pulse is amplified in a pulse amplifier 131 and integrated in a Miller integrator 132 forming the integrating circuit 103, as shown in FIGS. 4 and 6, to produce a sawtooth voltage as shown in FIG. 7k the amplitude of which is controlled by a variable resistor 104 shown in FIGS. 4 and 6. On the other hand, the controlled pulse is also supplied to a tilt control pulse generating circuit 105 shown in FIG. 4, from which a tilt control pulse, shown in FIG. 7l is derived, the polarity and amplitude of which are controlled by a variable resistor 151 as shown in FIG. 6.

Figure 7L:
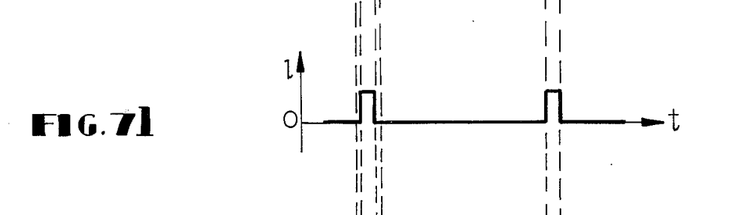
Figures 7M, 7N:
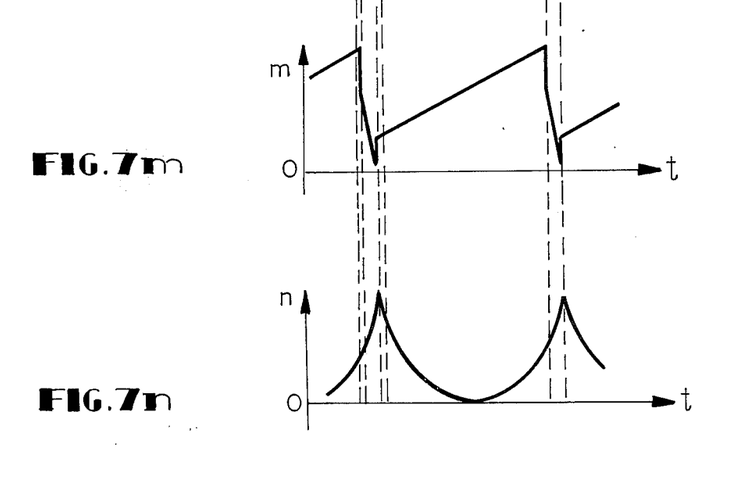

The amplitude controlled sawtooth voltage of FIG. 7k and the tilt control pulse of FIG. 7l are supplied to the bases of transistors 161 and 162, respectively, connected in a common collector configuration in a mixing circuit 106, shown in FIGS. 4 and 6, and from the common collector of the transistors, a mixed voltage as shown in FIG. 7m is derived. The mixed voltage is amplified in an amplifier 107 and is supplied through a clamping circuit 108 to one of the convergence coils 109, where the mixed voltage is integrated by the inductances thereof to produce a tilt controlled parabola current, the amplitude of the parabola component and the polarity and amplitude of the tilt component being controlled preferably by variable resistors 104 and 151, respectively. If it is necessary to provide additional control of the amplitude balance to produce a more preferred convergence current wave, the tilt control pulse is produced directly from the deflection drive pulse which is provided through the input terminal 101 to this apparatus as shown by the dotted line in FIG. 4.

If it is necessary to provide more power for converging electron beams such as in a blue convergence circuit, a separator 110 and an additional amplifier 107 made up of separate amplifiers 107a and 107b can be inserted between the mixing circuit 106 and the clamp circuit 108 as shown in FIG. 5 and FIG. 6. In this case, the mixed voltage from the mixing circuit 106 is supplied to a base of a transistor in the separator 110. One of the outputs derived from the collector and another from the emitter of the transistor are supplied to the respective amplifiers 107a and 107b, and to the two ends of the convergence coil 109, respectively, through the clamping circuit 108, which is a conventional clamping circuit, for instance a series connection of diode and a resistor.

Because of the pole pieces in the picture tube, the phase of the high frequency horizontal convergence fields tends to lag that of the currents more than it lags that of the vertical fields.

Figure 8I:
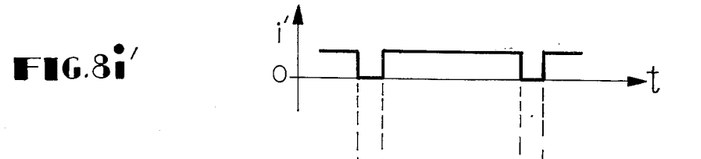
FIGS. 8i and 8j are diagrams of voltage waveforms and FIG. 8n is a diagram of a current waveform similar to FIGS. 7i, 7j and 7n at points i, j and n in FIG. 6, when a pulse width of the monostable multivibrator 102a of FIG. 6 is longer than a scanning period.
Figure 8J:
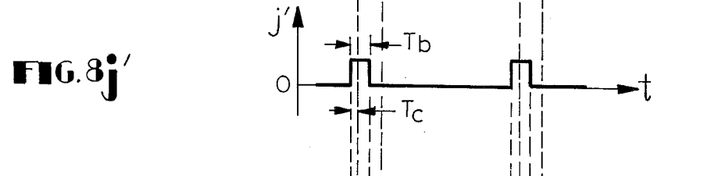
Figure 8N:
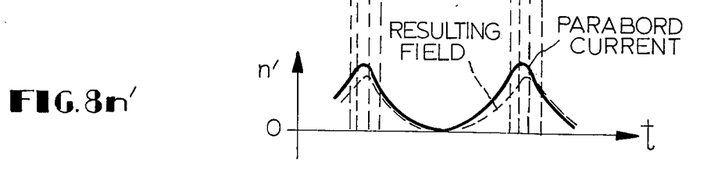

If the pulse width of the monostable multivibrator 102d in FIG. 4 is shorter than one horizontal period by only Tc, and the pulse width of the monostable multivibrator 102b is Tb which is equal to or shorter than the flyback period Tf, the position of the leading edge of the controlled pulse is substantially ahead of that of the horizontal drive pulse, as shown in FIG. 8i, by Tc, and the voltage waveform and the parabola current waveform thereof become as shown in solid lines in FIG. 8j' and FIG. 8n', respectively. The dotted line in FIG. 8n' shows the resultant convergence field the phase of which is preferably corrected so as to be adjusted to that of the horizontal deflection field. In a practical controlled pulse generating circuit, an inverter should be connected between the input circuit 101 and the monostable multivibrator 102a. In such a case, the pulse width of the monostable multivibrator need not be as long as that of the circuit shown in FIG. 6. This is advantageous from the viewpoint of the temperature characteristics of the monostable multivibrator.

Figure 9:
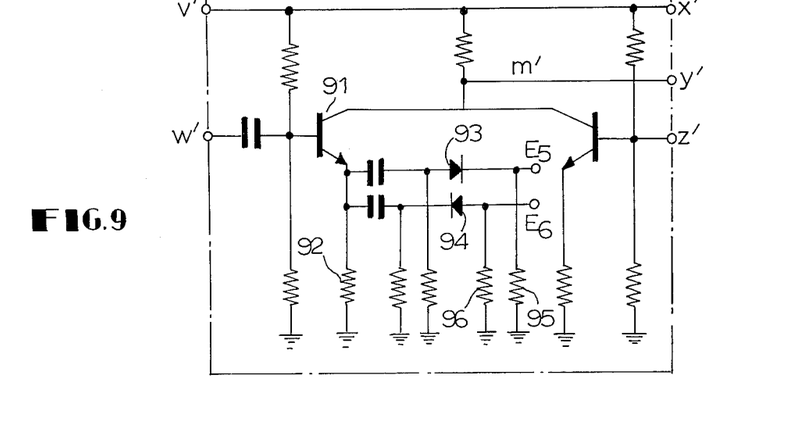
FIG. 9 is a circuit diagram of a mixing circuit which can be substituted for the mixing circuit 106 in FIG. 6 so that the circuit of FIG. 6 is suitable for a wider deflection angle color television system.

FIG. 9 shows another mixing circuit 106 in FIG. 6. The mixing circuit of FIG. 9 includes an expanding circuit, wherein points $v'$, $w'$, $x'$, $y'$ and $z'$ correspond to points $v$, $w$, $x$, $y$ and $z$, respectively, of circuit 106 in FIG. 6.

Figure 10M:
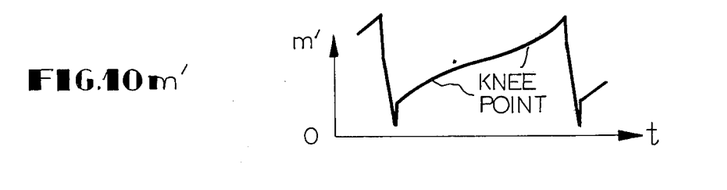
FIGS. 10m' and 10n' are diagrams showing a voltage waveform at a point m' in FIG. 9 and an improved parabola current in the mixing circuit shown in FIG. 9.
Figure 10N:
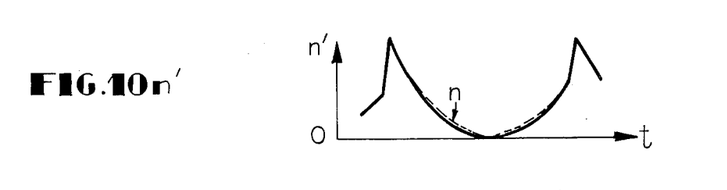

When the amplitude of the sawtooth voltage at the emitter of the transistor 91 of the mixing circuit of FIG. 9 becomes larger than the absolute value of the sum of the conductive voltage of the diode 93 and a positive bias voltage E5, or the sum of the conductive voltage of the diode 94 and a negative bias voltage E6, the respective diodes become conductive and resistor 95 or 96 is connected in parallel with the resistor 92. As a result, both end portions of the sawtooth voltage and the parabola current are expanded as shown in FIGS. 10m' and 10n', wherein the knee points on the sawtooth voltage wave are controlled by the bias voltages E5 and E6.

As previously mentioned, this mixing circuit is suitable for a color television reproducing system which has a wide deflection angle.

Figure 11:
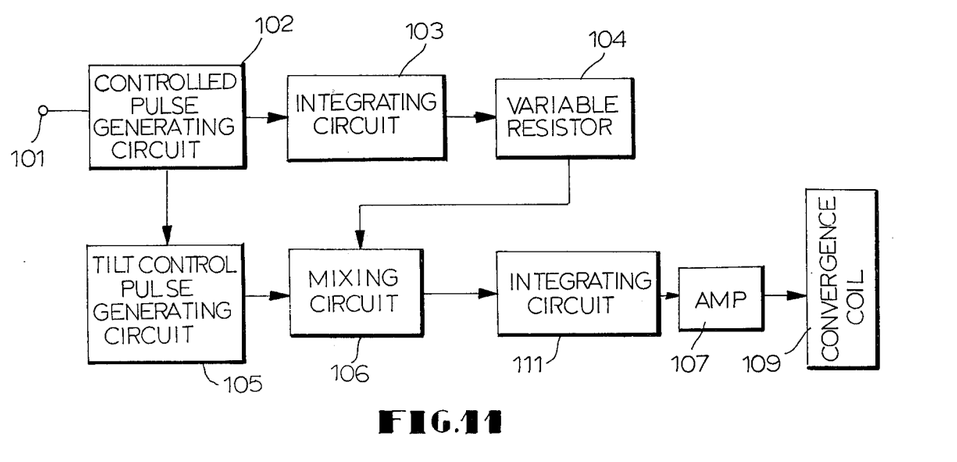
FIG. 11 is a block diagram showing the constitution of one convergence circuit unit of a vertical dynamic convergence apparatus according to this invention, which is similar to the embodiment shown in FIG. 4.

FIG. 11 shows a vertical dynamic convergence circuit for one of the three beams, the construction of which corresponds to that of the horizontal convergence circuit shown in FIG. 4. Because of the low frequency, the mix voltage from the mixing circuit 106 is not integrated sufficiently in the convergence coil 109. Consequently, an integrating circuit 111 is connected between the mixing circuit 106 and the amplifier 107 to integrate the mix voltage beforehand. Also in this case, the amplitude of the parabola component and the tilt component of the parabola current are controlled by changing the amplitude of the sawtooth component of the mix voltage and the polarity and the amplitude of the pulse component thereof.

Figure 12:
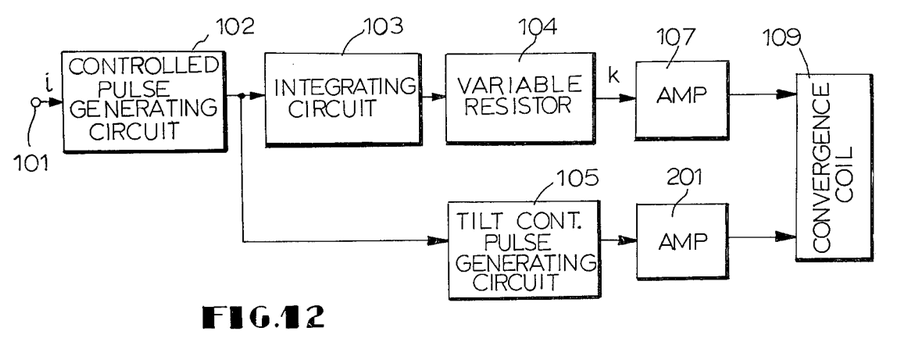
FIG. 12 is a block diagram showing the construction of one convergence circuit unit of a horizontal dynamic convergence apparatus according to this invention wherein the tilt control pulse is supplied to the convergence coil separately from the sawtooth voltage.
Figure 13:
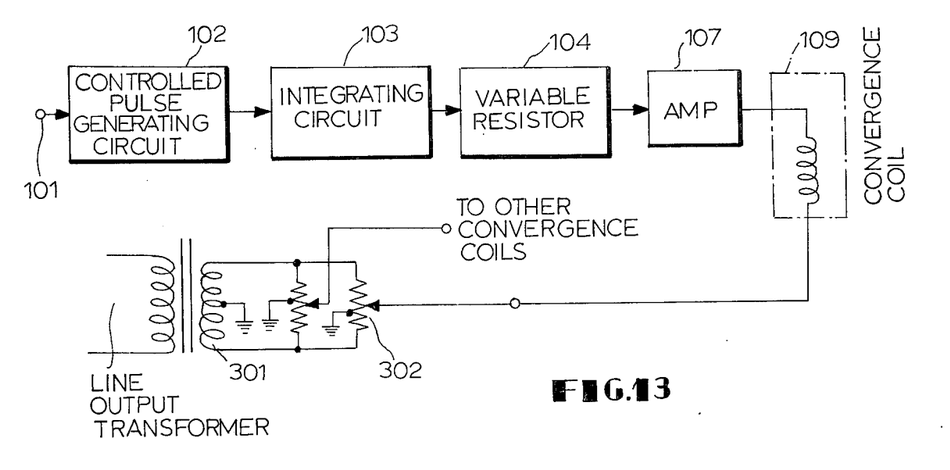
FIG. 13 is a block diagram showing the construction of one convergence circuit unit of a horizontal dynamic convergence apparatus according to this invention, wherein the tilt control pulse is derived from a winding of the line output transformer.

If it is necessary to reduce the power dissipation in the transistors of the amplifier 107, the tilt control pulse should be provided separately from the sawtooth voltage to the convergence coil 109 as shown in FIG. 12 and FIG. 13. In FIG. 12, the sawtooth voltage amplified in the amplifier 107 and the tilt control pulse amplified in the amplifier 201 are provided separately to the convergence coil 109. In FIG. 13, the tilt control pulse is obtained from an additional winding 301 of the line output transformer, and the polarity and amplitude thereof are controlled by a variable resistor 302 connected between the additional winding 301 and the convergence coil 109. It is not a problem that the width of the tilt control pulse is longer than that of the controlled pulse shown in FIG. 7j, so long as the sawtooth voltage is produced from the controlled pulse. As compared with the other embodiments, this embodiment is simpler and is useful for a simplified apparatus according to this invention.

Figure 14:
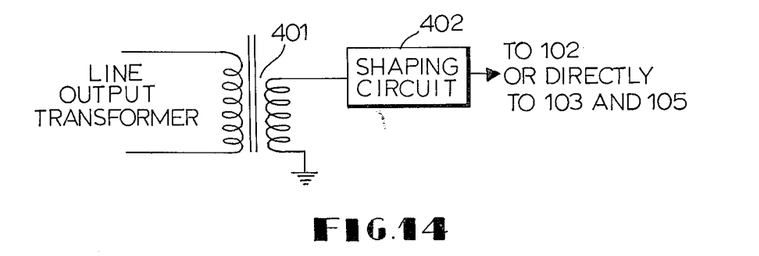
FIG. 14 is a diagram of another embodiment of an input circuit and a controlled pulse generating circuit corresponding to the input circuit 101 and the controlled pulse generating circuit 102 in FIG. 4.

In the embodiments described above, if there is no relation between the variable resistor 21 (or 121) and the vertical (or horizontal) deflection hold circuit which controls the phase difference between the deflection drive pulse and the deflection current, the state of the convergence changes when each hold circuit is controlled to change the phase difference between the deflection drive pulse and the deflection current. To get ride of this problem, the input circuit 1 or 101 is coupled to a latter stage of a deflection oscillating circuit of the color television reproducing system. For instance, it may be coupled to a field or a line oscillator or to a field or a line output transformer to derive therefrom a pulse the phase of which has been adjusted preferably by the vertical or horizontal hold circuit. FIG. 14 illustrates one of those embodiments, in which a shaping circuit 402 is connected to a winding 401 of the line output transformer and generates a pulse the width of which is shorter than the flyback pulse derived from the winding 401. The derived pulse is supplied to the controlled pulse generator 102 or directly to the integrating circuit 103 and the tilt control pulse generating circuit 105. As the convergence parabola currents are produced from the controlled pulse which is always in phase with the deflection oscillating pulse and which pulse width is shorter than that of the flyback period, the state of convergence is not affected by the deflection hold circuit and the parabola current waveform is improved.

The discussion above is believed to make clear the points of the invention. Of course at least one other convergence circuit unit like the unit shown in FIG. 6 is necessary for converging the electron beams for the other two colors and in such unit the controlled pulse generating circuit and the integrating circuit of the unit can be in common with those of the unit in FIG. 6.

Although this invention has been particularly shown and described, it is contemplated that various changes and modifications may be made without departing from the scope of the invention as set forth in the following claims.

What is claimed is:

1. A dynamic convergence apparatus for a color television reproducing system to which a deflection drive pulse is provided as a pulse separate from the color component signals or is a synchronizing pulse for the system, said apparatus comprising:
    input circuit means to which said deflection drive pulse is supplied,
    controlled pulse generating means coupled to said input circuit means for responding to the output thereof for generating a controlled pulse the position of the leading edge of which is adjusted to correspond to that of said deflection drive pulse and the pulse width of which is no longer than a flyback period of the color television reproducing system, and
    circuit means coupled to said controlled pulse generating means and responsive to said controlled pulse for generating a parabola current which flows through a convergence coil, whereby the phase of the resultant convergence field has substantially no distortion at the end of a blanking period of the color television reproducing system.

2. A dynamic convergence apparatus for a color television reproducing system to which a deflection drive pulse is provided as a pulse separate from color component signals or is a synchronizing pulse for the system, said apparatus comprising:
    input circuit means to which said deflection drive pulse is supplied;
    controlled pulse generating means coupled to said input circuit means for responding to the output thereof for generating a controlled pulse, the position of the leading edge of which is adjusted to correspond to that of said deflection drive pulse and the pulse width of which is no longer than a flyback period of the color television reproducing system; and
    parabola current generating means coupled to said controlled pulse generating means for responding to said controlled pulse for generating parabola currents having desired characteristics which flow through the convergence coil, and including means for controlling the amplitude and amplitude balance of the parabola current in the first half and the second half of the scanning period of the deflection, whereby the phase of the resultant convergence fields have substantially no distortion at the end of a blanking period of the color television reproducing system.

3. A dynamic convergence apparatus as claimed in claim 2, wherein said controlled pulse generating means comprises:
    means for setting the time lag Ta of said conrolled pulse in comparison with said deflection drive pulse, and
    means coupled to said time setting means for setting the pulse width Tb of said controlled pulse so that the time interval Ta+Tb is shorter than the flyback period of the color television reproducing system.

4. A dynamic convergence apparatus as claimed in claim 2, wherein said controlled pulse generating means comprises:
    means for setting the position of the leading edge of said controlled pulse substantially ahead of that of said deflection drive pulse; and
    means coupled to said leading edge position setting means for setting the pulse width Tb of said controlled pulse so that the pulse width Tb is no longer than the flyback period of the color television reproducing system.

5. A dynamic convergence apparatus as claimed in claim 2, wherein said input circuit means is a circuit for producing an output pulse the phase of which is controlled together with the phase of the deflection field.

6. A dynamic convergence apparatus as claimed in claim 5, wherein said input circuit means is coupled to a deflection oscillating circuitry for producing an output pulse the phase of which is controlled together with that of the deflection field.

7. A dynamic convergence apparatus as claimed in claim 2 wherein said parabola current generating means comprises:
    sawtooth voltage generating means coupled to said controlled pulse generating means for responding to said controlled pulse to generate a sawtooth voltage; and
    circuit means for responding to said sawtooth voltage to produce parabola currents which flow through convergency coils, and convergence control means coupled to said circuit means for controlling the amplitude and the amplitude balance of said parabola currents in the first half and the second half of the scanning period.

8. A dynamic convergence apparatus as claimed in claim 7 wherein said sawtooth voltage generating means includes expanding circuit means for expanding the leading trailing edge portions of said generated sawtooth voltage in comparison with the center portion thereof, whereby the amplitude of both edge portions of said parabola currents become substantially greater.

9. A dynamic convergence apparatus as claimed in claim 2, wherein said parabola current generating means comprises:
    a sawtooth voltage generating means coupled to said controlled pulse generating means for responding to said controlled pulse for generating a sawtooth voltage;
    first control circuit means coupled to said controlled pulse generating means for responding to said controlled pulse for generating a tilt control pulse the polarity and amplitude of which are controllable;
    second control circuit means coupled to said sawtooth voltage generating means for controlling the amplitude of said sawtooth voltage;

circuit means coupled to first and second control circuit means for responding to both said tilt control pulse and amplitude controlled sawtooth voltage for generating a parabola current, the amplitude and amplitude balance of which are controllable by said first and second control circuit means.

10. A dynamic convergence apparatus as claimed in claim 2, wherein said input circuit means includes a deflection output transformer winding through which a pulse is generated during the flyback period, and said controlled pulse generating means consists of a shaping circuit which responds to said pulse to produce a controlled pulse the pulse width of which is shorter than the flyback period.

11. A dynamic convergence apparatus for a color television reproducing system to which a deflection drive pulse is provided as a pulse separate from the color component signals or is a synchronizing pulse for the system, said apparatus comprising:
input circuit means to which said deflection drive pulse is supplied;
controlled pulse generating means coupled to said input circuit means for responding to the output thereof for generating a controlled pulse the position of the leading edge of which is adjusted to correspond to that of said deflection drive pulse and the pulse width of which is no longer than a flyback period of the color television reproducing system;
sawtooth voltage generating means coupled to said controlled pulse generating means for responding to said controlled pulse for generating a sawtooth voltage;
first control circuit means coupled to said controlled pulse generating means for generating a tilt control pulse which is synchronized with said deflection drive pulse and the polarity and amplitude of which are controllable;
second control circuit means coupled to said sawtooth voltage generating means for controlling the amplitude of said sawtooth voltage; and
circuit means coupled to said first and second control circuit means for responding both to said tilt control pulse and said amplitude controlled sawtooth voltage for generating a parabola current which flows through a convergence coil.

12. A dynamic convergence apparatus as claimed in claim 11, wherein said first control circuit means is a circuit for responding to said controlled pulse for generating said tilt control pulse, and comprises mixing circuit means coupled to both said first control circuit means and said second control circuit means for generating a mixed voltage, and parabola current generating circuit means coupled to said mixing circuit means for responding to said mixed voltage to generate said parabola current.

13. A dynamic convergence apparatus as claimed in claim 11, wherein said first control circuit means comprises:
means for deriving two pulses from said deflection drive pulse in a flyback period of the color television reproducing system, the polarities of said pulses being opposite to each other, and
tilt control pulse generating means for responding to both pulses for generating said tilt control pulse.

14. A dynamic convergence apparatus as claimed in claim 13, wherein said two pulse deriving means consists of windings wound on the deflection output transformer.

15. A dynamic convergence apparatus as claimed in claim 12 in which said mixing circuit means includes an integrating circuit means for integrating said mixed voltage to produce a parabola current.

16. A dynamic convergence apparatus as claimed in claim 11, wherein said controlled pulse generating means comprises:
means for setting the time lag Ta of said controlled pulse relative to that of said deflection drive pulse; and
means coupled to said time lag setting means for setting the pulse width Tb of said controlled pulse so that the time interval Ta+Tb is shorter than the flyback period of said color television reproducing system, whereby the phase of the resultant convergence fields is substantially adjusted to that of the deflection field and parabola currents which flow through said convergence coils have substantially no distortion at the end of the blanking period.

17. A dynamic convergence apparatus as claimed in claim 11, wherein said controlled pulse generating means comprises:
means for setting the position of the leading edge of said controlled pulse substantially ahead of that of said deflection drive pulse; and
means coupled to said leading edge position setting means for setting the pulse width Tb of said controlled pulse so that said pulse width Tb is no longer than the flyback period of said color television reproducing system, whereby the phase of the resultant convergence fields is substantially adjusted to that of the deflection field, and parabola currents which flow through said convergence coils have substantially no distortion at the end of the blanking period.

18. A dynamic convergence apparatus as claimed in claim 11, wherein said sawtooth voltage generating means comprises:
a sawtooth voltage generating circuit for responding to said controlled pulse for generating a sawtooth voltage; and
expanding circuit means coupled to said sawtooth voltage generating circuit for amplifying the leading and trailing edge portions of said generated sawtooth voltage more than the center portion thereof, whereby the amplitude of both edge portions of said parabola currents becomes greater.

19. A dynamic convergence apparatus as claimed in claim 12, wherein said first control circuit means comprises:
pulse generating means for responding to said controlled pulse for generating pulses which have polarities opposite to each other; and
tilt control pulse generating means coupled to said pulse generating means for responding to said generated pulses for producing a tilt control pulse the polarity and amplitude of which are controllable.

* * * * *